(12) United States Patent
Kakinuma

(10) Patent No.: US 8,426,859 B2
(45) Date of Patent: Apr. 23, 2013

(54) SEMICONDUCTOR DEVICE AND LIGHT-EMITTING DEVICE USING THE SAME

(75) Inventor: Nobuaki Kakinuma, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/397,390

(22) Filed: Feb. 15, 2012

(65) Prior Publication Data
US 2012/0211750 A1     Aug. 23, 2012

(30) Foreign Application Priority Data
Feb. 21, 2011    (JP) .................................. 2011-034787

(51) Int. Cl.
H01L 29/04     (2006.01)
H01L 31/20     (2006.01)

(52) U.S. Cl.
USPC ................. 257/57; 257/40; 257/71; 438/128; 438/151; 438/153

(58) Field of Classification Search .................... 257/57, 257/40, 71, E33.003, E33.004, E29.273; 438/128, 151, 153
See application file for complete search history.

(56) References Cited

U.S. PATENT DOCUMENTS 8,212,257 B2 * 7/2012 Kimura ........................... 257/72
8,227,807 B2 * 7/2012 Yamazaki et al. .............. 257/59

FOREIGN PATENT DOCUMENTS
JP     2003-241687 A     8/2003

* cited by examiner

*Primary Examiner* — Theresa T Doan
(74) *Attorney, Agent, or Firm* — Canon U.S.A., Inc. IP Division

(57) ABSTRACT

A semiconductor device includes a semiconductor layer, a first insulating layer, a gate electrode which is formed on the first insulating layer and has a portion overlapping a channel region of the semiconductor layer with the first insulating layer sandwiched in between, a second insulating layer which is formed on the first insulating layer and covers the gate electrode, and a capacitor electrode which is formed on the second insulating layer and has a portion facing the gate electrode with the second insulating layer sandwiched in between. The second insulating layer has a thin portion, whose thickness is thinner than that of the second insulating layer in surrounding regions, on the portion of the gate electrode overlapping the channel region. A part of the capacitor electrode faces the portion of the gate electrode overlapping the channel region with the thin portion of the second insulating layer sandwiched in between.

6 Claims, 4 Drawing Sheets

SEMICONDUCTOR DEVICE AND LIGHT-EMITTING DEVICE USING THE SAME

BACKGROUND OF THE INVENTION

1. Field of the Invention

Embodiments of the present invention relate to a semiconductor device and a light-emitting device, and more specifically, to a semiconductor device including a transistor and a light-emitting device such as an organic electroluminescence display device using the semiconductor device as a drive circuit.

2. Description of the Related Art

A semiconductor device including a transistor is used in a pixel circuit of a liquid crystal display device and an organic EL display device. The pixel circuit is provided for each pixel of a display device. Each pixel circuit drives a pixel of a liquid crystal element or an organic EL element.

FIG. 2 shows a pixel circuit of a typical organic EL display device. The pixel circuit includes an organic electroluminescence element (hereinafter referred to as "organic EL element") EL, a drive transistor Tr1 that supplies power to the organic EL element, a selection transistor Tr2 that turns on during a selection period and obtains data, a capacitor Cap that holds data, a data line L1, a selection line L2, and a power source line L3, and the like. The pixel circuit is connected to one electrode of the organic EL element, which is the anode. The cathode, which is the other electrode of the organic EL element, is fixed to a constant potential, which is the ground potential.

When the selection transistor Tr2 is turned on by the selection line L2, a signal transmitted from the data line L1 is held by the capacitor Cap. The voltage held by the capacitor Cap determines current flowing through the drive transistor Tr1. When the current flows through the organic EL element, the organic EL element emits light. The magnitude of the current determines the intensity of emitted light.

The voltage held by the capacitor Cap is changed by leakage current of the selection transistor Tr2 when the selection transistor Tr2 is turned off, so that the change of the voltage changes the current of the drive transistor Tr1 and changes the light emitting state of a display panel. When the degree of the change of the light emitting state is significant, bright spots and dark spots appear, so that the display quality degrades. Therefore, even when some leakage current occurs, the voltage between both terminals of the capacitor Cap needs to be hardly changed.

Japanese Patent Laid-Open No. 2003-241687 proposes a liquid crystal display device in which, when a holding capacitor Cap of a liquid crystal element is formed of an interlayer insulating film between a gate electrode layer and a drain electrode layer, to obtain a large capacitor Cap, the thickness of the interlayer insulating film in an area where the upper and the lower electrode layers overlap each other is thinned.

In a liquid crystal display device, the pixel circuit generally includes the selection transistor Tr2 and the capacitor Cap. On the other hand, in a display device such as an organic EL display device which includes light-emitting elements, light is emitted from the light-emitting elements by constantly flowing current through the light-emitting elements, so that the drive transistor Tr1 for supplying current and the power source line L3 are required in addition to the configuration of the liquid crystal display device. Therefore, space for forming the capacitor Cap that holds data is extremely limited. In an organic EL display device having a high pixel density, the area of one pixel is small, so that it is difficult to form a capacitor having a sufficient capacity.

SUMMARY OF THE INVENTION

One disclosed aspect of the embodiments provides a semiconductor device including a semiconductor layer including a drain region, a channel region, and a source region, a first insulating layer covering the semiconductor layer, a gate electrode which is formed on the first insulating layer and has a portion overlapping the channel region of the semiconductor layer with the first insulating layer sandwiched in between, a second insulating layer which is formed on the first insulating layer and covers the gate electrode, a drain electrode and a source electrode which are formed on the second insulating layer and respectively connected to the drain region and the source region of the semiconductor layer through a contact hole formed in the first insulating layer and the second insulating layer, and a capacitor electrode which is formed on the second insulating layer and has a portion facing the gate electrode with the second insulating layer sandwiched in between. The second insulating layer has a thin portion, whose thickness is thinner than that of the second insulating layer in surrounding regions, on the portion of the gate electrode overlapping the channel region, and a part of the capacitor electrode faces the portion of the gate electrode overlapping the channel region with the thin portion of the second insulating layer sandwiched in between.

The gate electrode and the capacitor electrode face each other above the channel region with the thin interlayer insulating film sandwiched in between, so that a capacitor having a large capacity may be formed. Therefore, it is possible to reduce the areas occupied by capacitors outside the portion above the channel region.

Further features of the embodiments will become apparent from the following description of exemplary embodiments with reference to the attached drawings.

DESCRIPTION OF THE EMBODIMENTS

A semiconductor device in which circuit elements such as a transistor, a resistance, a capacitor are connected by wiring includes an amorphous or crystal semiconductor layer patterned on a glass substrate or a silicon substrate by photolithography technique or the like, an electrode and wiring layer formed of a conductor such as a metal, an insulating layer formed of an insulating material, and the like. The semiconductor device is used in a drive circuit of a liquid crystal element and an organic EL element.

Figure 1:
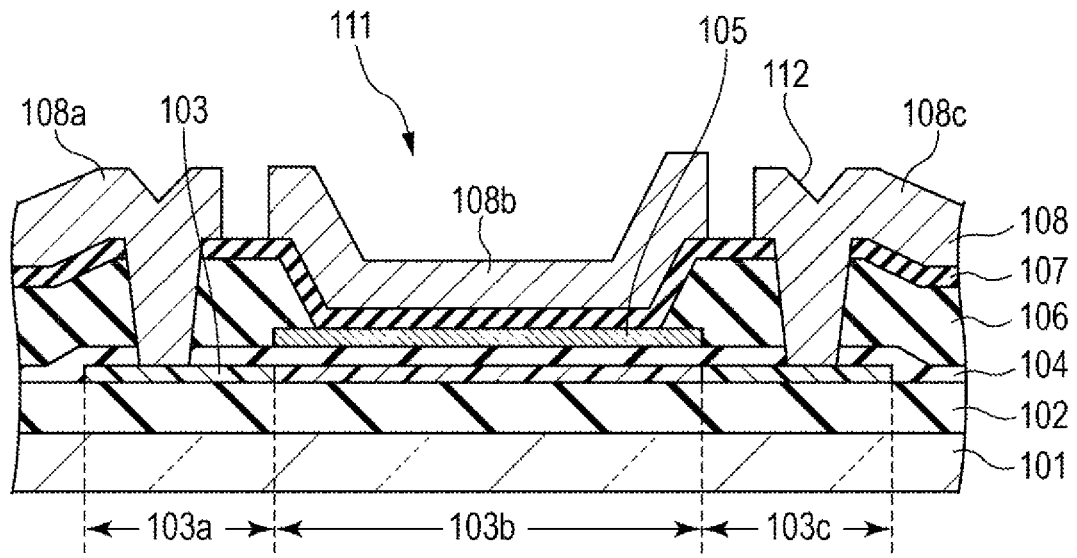
FIG. 1 is a cross-sectional view of a transistor, which is a semiconductor device according to one embodiment.

FIG. 1 is a diagram showing a cross-sectional structure of a transistor used in a semiconductor device according to one embodiment. FIG. 1 shows a top gate type thin film transistor, which is a drive transistor (Tr1 in FIG. 2) of a pixel circuit.

A semiconductor layer 103 having a thickness of 30 to 100 nm is formed and patterned on a substrate 101 via a buffer layer 102 having a thickness of 50 to 500 nm. The semiconductor layer 103 is divided into a drain region 103a and a source region 103c which are doped with high-density impurities and a channel region 103b which includes no impurity or includes relatively low-density impurities. The semiconductor layer 103 is covered with a first insulating layer (hereinafter referred to as "gate insulating layer") 104 having a thickness of 50 to 200 nm. A gate electrode 105 is stacked above the channel region 103b with the gate insulating film 104 sandwiched in between. The gate electrode 105 is formed of a high melting point metal, such as Mo, MoW, or MoCr, having a thickness of 50 to 500 nm. The gate electrode 105 is extended from the channel region 103b and forms a selection line (L2 in FIG. 2).

A second insulating layer (referred to as "interlayer insulating film") covering the gate electrode 105 is formed on the gate insulating film 104. The interlayer insulating film includes two layers which are a lower interlayer insulating film 106 having a thickness of 100 to 800 nm and an upper interlayer insulating film 107 having a thickness of 50 to 200 nm. However, the interlayer insulating film includes only the upper interlayer insulating film 107 on the gate electrode 105. Therefore, the thickness of the interlayer insulating film above the channel region is thinner than that of the interlayer insulating film in the surrounding regions. The lower interlayer insulating film 106 forms two-layer interlayer insulating film together with the upper interlayer insulating film 107 in almost entire region including the edges of the gate electrode 105 except for an area in which an opening 111 is formed above the gate electrode 105. The two-layer portion of the interlayer insulating film is thicker than the one-layer portion and smoothly covers uneven portions formed by the gate electrode 105 and the semiconductor layer 103.

The upper interlayer insulating film 107 functions as the second insulating layer that forms a capacitor, so that the upper interlayer insulating film 107 should be thin as much as possible in a range in which the upper interlayer insulating film 107 normally functions as an insulating film. The lower interlayer insulating film 106 and the upper interlayer insulating film 107 are formed by using an inorganic insulating film such as silicon oxide, silicon nitride, aluminum oxide, and yttrium oxide.

It is possible to turn the two-layer interlayer insulating film upside down, so that the opening 111 is formed in the upper interlayer insulating film 107 and only the lower interlayer insulating film 106 is left above the channel region.

A drain electrode 108a, a capacitor electrode 108b, and a source electrode 108c are formed of the same metal film 108 on the upper interlayer insulating film 107. The metal film 108 is a laminated film of Ti, W, Mo, Cr, an alloy of these metals, and an Al alloy. Although not shown in FIG. 3, a power source line (L3 in FIG. 2) and a data line (L1 in FIG. 2) are also formed of the same metal film 108. Contact holes 112, which penetrate through the gate insulating film 104 and the interlayer insulating films 106 and 107, are formed on the drain region 103a and the source region 103c of the semiconductor layer 103. The drain electrode 108a and the source electrode 108c are connected to the drain region 103a and the source region 103c respectively through the contact holes 112.

The capacitor (Cap in FIG. 2) is formed in a portion where the gate electrode 105 and the capacitor electrode 108b face each other with the upper interlayer insulating film 107 having a thin film thickness sandwiched in between above the channel region 103b. The capacity of the capacitor Cap is determined by the thickness and area of the upper interlayer insulating film 107 in the portion where the gate electrode 105 and the capacitor electrode 108b face each other.

The capacitor electrode 108b is not only located above the channel region, but also extended from there and connected to other circuit elements such as the power line. The gate electrode is also extended from the channel region, and it is possible to form a capacitor by overlapping a part of the gate electrode and a part of the capacitor electrode outside the channel region. Hereinafter, the capacitor formed above the channel region is denoted by Cap1 and the capacitor formed outside the channel region is denoted by Cap2. Although the capacitor Cap2 outside the channel region may be formed by causing the gate electrode and the capacitor electrode to face each other in an area where the interlayer insulating film has two layers, the capacitor Cap2 outside the channel region may be formed by thinning the interlayer insulating film in a portion where the gate electrode and the capacitor electrode face each other in the same manner as thinning the interlayer insulating film above the channel region.

Figure 2:
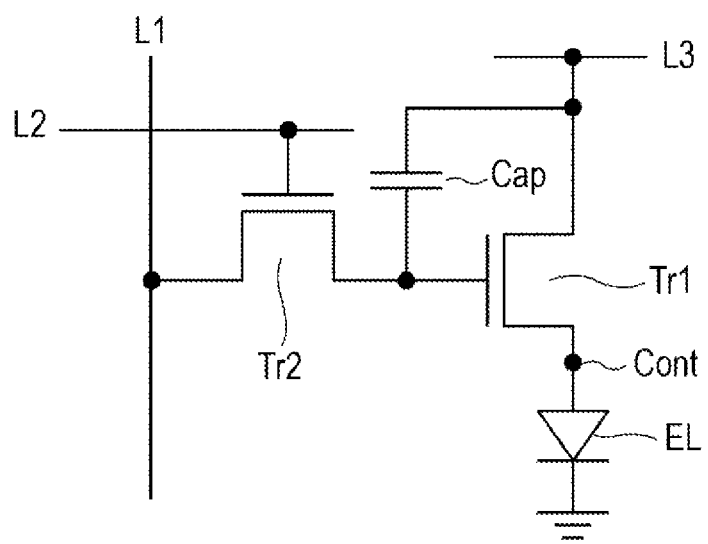
FIG. 2 is an example of a pixel circuit of an organic EL display device.

In the pixel circuit shown in FIG. 2, the capacitor Cap is connected between the gate and the source of the drive transistor Tr1. In this case, the capacitor electrode 108b and the source electrode 108c may be one continuous electrode.

Although there are pixel circuits of an organic EL display device different from the pixel circuit shown in FIG. 2, in many pixel circuits, one terminal of the capacitor that holds data is connected to the gate of the drive transistor. Although the other terminal is not necessarily connected to the source of the drive transistor, a capacitor may be formed above the channel region as described above in a pixel circuit in which at least one terminal of the capacitor is connected to the gate of the transistor.

As described above, in an organic EL display device, a portion above the channel region in the drive transistor may be effectively used as a space to form a capacitor.

The width W and the length L of the channel region of the transistor are determined by the response speed and the amount of flowing current, so that the width W and the length L are not directly related to the capacity of the capacitor Cap necessary as the pixel circuit. Therefore, even when the capacitor Cap1 is formed above the channel region, it is not possible to adjust the capacity of the capacitor by freely selecting the area of the channel region. In one embodiment, the thickness of the interlayer insulating film above the channel region is formed thinner than that of the interlayer insulating film in the surrounding regions, and a capacitor is formed there. Although the area of the channel region is determined, the capacity value of the capacitor may be changed by changing the thickness of the interlayer insulating film. The capacity of the capacitor Cap1 above the channel region is increased by thinning the film thickness as needed, and thereby the area occupied by the capacitor Cap1 outside the channel region may be reduced.

In addition to the above example, in a circuit in which one terminal of the capacitor is connected to the gate of the transistor, the capacitor may be formed above the channel region of the transistor. The embodiments may be applied to any light-emitting device including a light-emitting element, a drive transistor that supplies power to the light-emitting element, and a capacitor that holds electric current data.

Figure 3A:
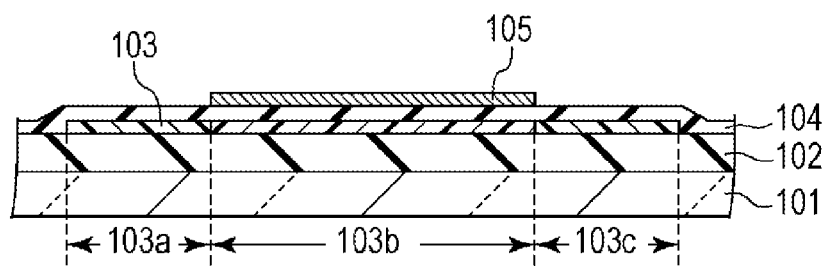
FIGS. 3A, 3B, 3C, 3D, and 3E are cross-sectional views of a transistor, which is a first embodiment, during manufacturing and after completion.
Figure 3B:
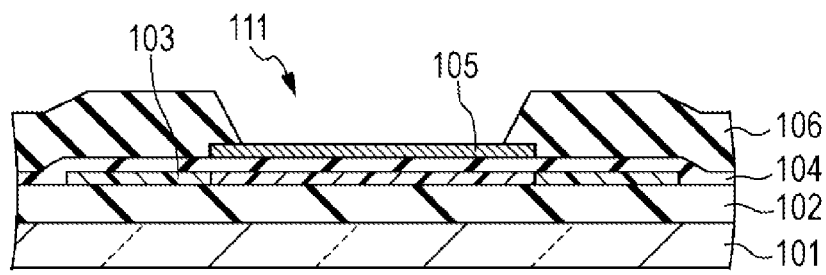

Hereinafter, the embodiments will be described by using a pixel circuit including an organic EL element as an example.
First Embodiment FIGS. 3A, 3B, 3C, and 3D show cross-sectional structures of the drive transistor Tr1 in FIG. 2 in manufacturing processes and FIG. 3E shows a cross-sectional structure of the drive transistor Tr1 formed finally.

The buffer layer 102 having a film thickness of 500 nm, which is made of silicon oxide, silicon nitride, or a laminated structure of silicon oxide and silicon nitride, is formed by a plasma CVD method on the substrate 101 made of an insulating material such as glass.

After the buffer layer 102 is formed, the semiconductor layer 103 having a film thickness of 30 to 100 nm, which is made of amorphous silicon, is further formed by the plasma CVD method. Next, the semiconductor layer 103 is converted into polysilicon by a crystallization method such as irradiation of excimer laser or plasma jet, or heat treatment. Thereafter, the semiconductor layer 103 converted into polysilicon is patterned by a photolithography process and an etching process.

After the semiconductor layer 103 is formed, the gate insulating film 104 made of silicon oxide is formed by the plasma CVD method. Further, ion implantation for controlling threshold voltage is performed on the semiconductor layer 103.

Next, a metal film to be the gate electrode is formed by a sputtering method, and the metal film is patterned by a photolithography process and an etching process to form the gate electrode 105. At the same time, the selection line L2 is formed. The gate electrode 105 is not only formed on an area overlapping the semiconductor layer 103, but also extended from there and continuously connected to the selection line L2.

Next, ion implantation is performed on the semiconductor layer 103 by using the gate electrode 105 as a mask. By this ion implantation, the channel region 103b on which only the ion implantation for controlling threshold voltage is performed, the source region 103a, and the drain region 103c are formed in the semiconductor layer 103. FIG. 3A shows a result of the processes described above.

Next, the lower interlayer insulating film 106 is formed, and the opening 111 is made in a part of an area above the channel region 103b by a photolithography process and an etching process. The thickness of the lower interlayer insulating film 106 is 300 nm. FIG. 3B shows a result of this process.

Figure 3C:
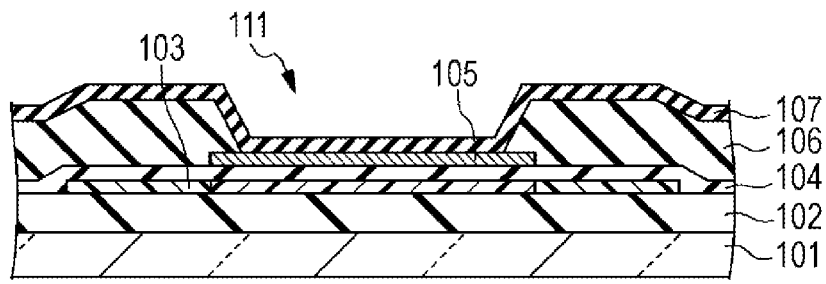

Next, as shown in FIG. 3C, the upper interlayer insulating film 107 is formed. The thickness of the upper interlayer insulating film 107 is 100 nm.

By the above processes, the upper interlayer insulating film including only one layer is formed above the channel region, and two-layer interlayer insulating film including upper and lower layers is formed in areas surrounding the channel region. The thickness of the interlayer insulating film is 400 nm in the two-layer portion and one-fourth of 400 nm in the one-layer portion.

Figure 3D:
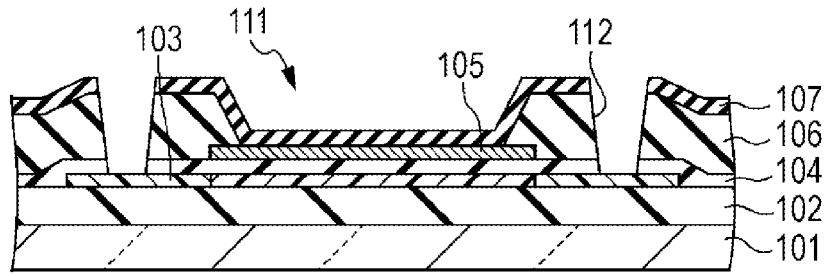
Figure 3E:
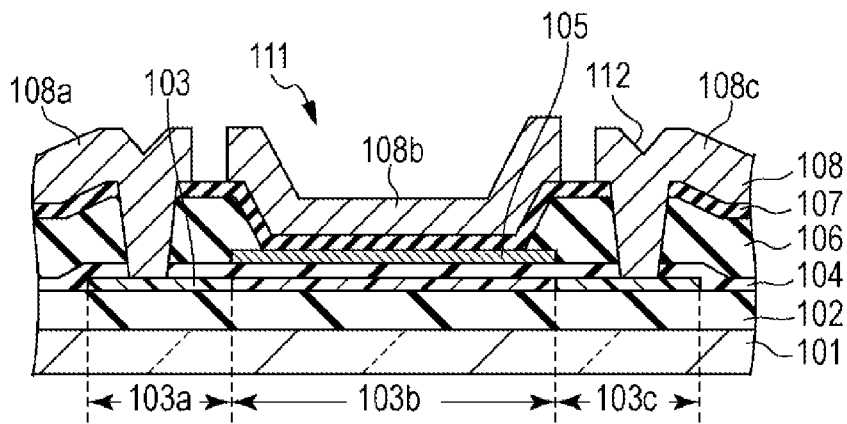

Next, as shown in FIG. 3D, the contact holes 112 penetrating the upper interlayer insulating film 107, the lower interlayer insulating film 106, and the gate insulating film 104 are formed by a photolithography process and an etching process.

Next, the metal film 108 is formed by a sputtering method, and the metal film 108 is patterned by a photolithography process and an etching process to form the drain electrode 108a, the capacitor electrode 108b, and the source electrode 108c. At the same time, the data line L1 and the power source line L3 are also formed. The power source line L3 is connected to the source electrode 108c, and the data line L1 is connected to a drain electrode of a selection transistor Tr2 formed separately from FIG. 2. As a result, the transistor shown in FIG. 3E is completed. The transistor shown in FIG. 3E has the same structure as that of the transistor shown in FIG. 1.

In the transistor manufactured through the processes described above, the gate electrode 105 is one electrode of the capacitor and the gate electrode 105 faces the metal film 108, which is the other electrode (capacitor electrode) of the capacitor, via the upper interlayer insulating film 107.

Figure 4A:
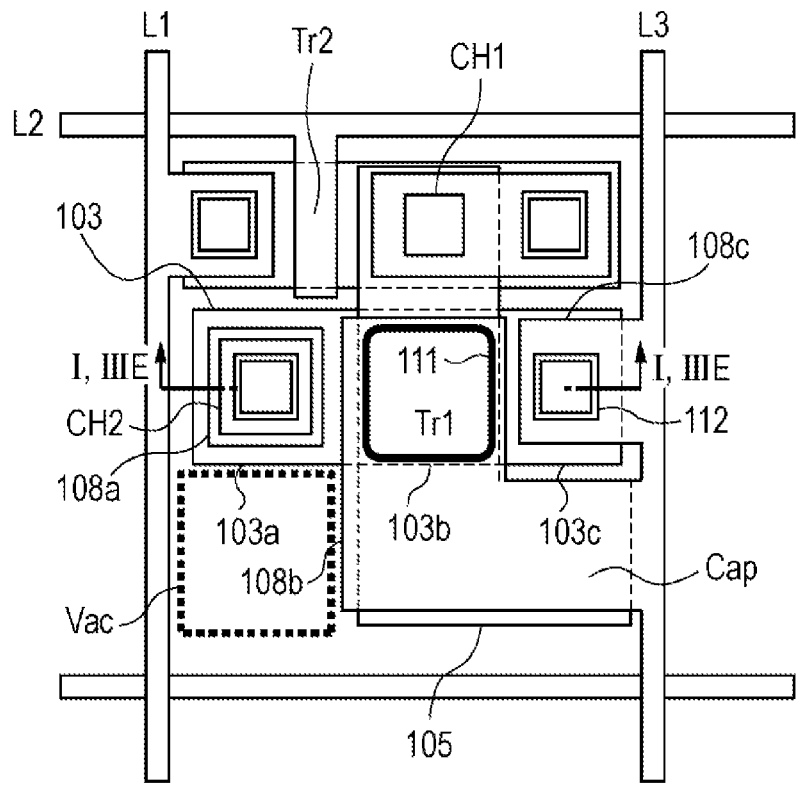
FIG. 4A is a layout diagram of a pixel circuit according to one embodiment.

FIG. 4A is a layout diagram of the pixel circuit in which the capacitor is formed above the channel region. The pixel circuits are arranged in a matrix form at a pitch of 120 μm.

The cross-sectional structures of the transistor taken along line I-I and line IIIE-IIIE are shown in FIGS. 1 and 3E. The circuit configuration is shown in FIG. 2. The same portions as those in FIGS. 1 to 3 are denoted by the same reference characters.

The source electrode of the selection transistor Tr2 is connected to the data line L1 and the selection transistor Tr2 receives a gate control signal from the selection line L2. The drain electrode of the selection transistor Tr2 is connected to the gate electrode 105 of the drive transistor in a contact hole CH1. The gate electrode 105 extends from the contact hole CH1 and overlaps the channel region 103b of the drive transistor Tr1 located at the center of the pixel. The opening 111 is formed in the lower interlayer insulating film 106 above the gate electrode of the channel region 103b, and further the capacitor electrode 108b extended from the power source line L3 overlaps the opening 111 to form the capacitor Cap1.

The capacitor is formed not only above the channel region, but also outside the channel region. The gate electrode 105 extends toward the lower side of the pixel beyond the channel region 103b, and the extending portion overlaps the capacitor electrode 108b to form the capacitor Cap2 outside the channel region. The total capacity of the capacitors for holding data is Cap1+Cap2.

The organic EL element not shown in the drawings is formed to overlap an upper portion of the pixel circuit, and current is supplied to the organic EL element from the drain electrode 108a of the drive transistor Tr1 via the contact hole CH2.

Figure 4B:
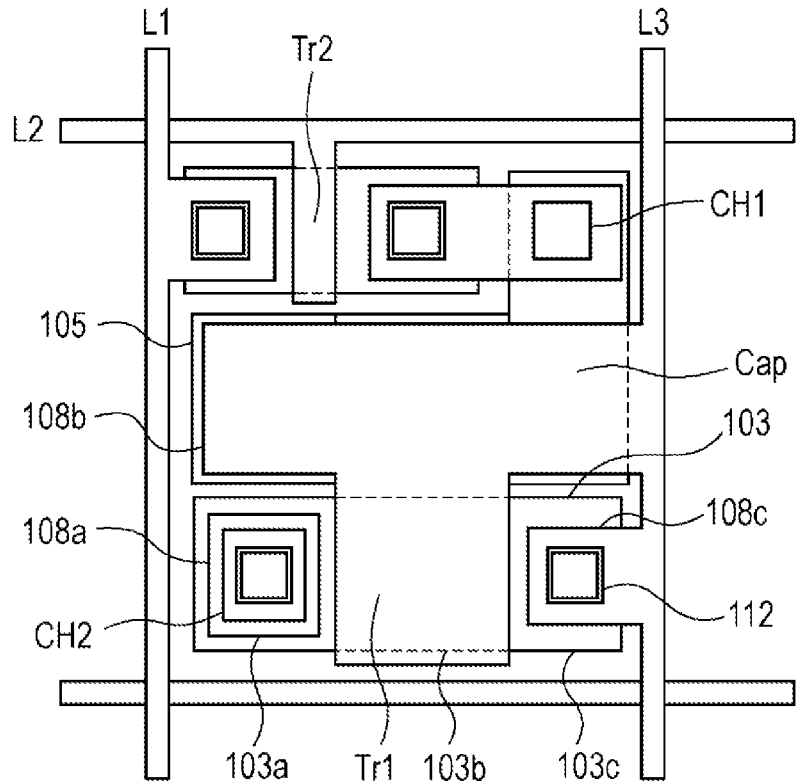
FIG. 4B is a layout diagram of a conventional pixel circuit.

FIG. 4B is a conventional layout example shown for comparison. The interlayer insulating film above the channel region has the same thickness as that of the interlayer insulating film in the surrounding regions, and the capacitor Cap2 is formed only outside the channel region.

The gate electrode 105 is connected to the source electrode of the selection transistor Tr2 in the contact hole CH1, and the gate electrode 105 overlaps the channel region 103b of the drive transistor Tr1 disposed near the lower side of the pixel and controls the drive transistor Tr1. The gate electrode 105 overlaps the capacitor electrode 108b extended from the power source line L3 at the center of the pixel and forms the capacitor Cap2.

FIG. 4B shows the pixel circuit so that the sizes of each portion of the transistors Tr1 and Tr2 and the area of the capacitor Cap are the same as those in FIG. 4A. The capacity values of the capacitors in FIG. 4A are Cap1=400 fF, Cap2=180 fF, and the total capacity Cap=Cap1+Cap2=580 fF. On the other hand, the capacity value of the capacitor in FIG. 4B, in which the capacitor is located only outside the channel region, is Cap=Cap2=360 fF.

In the layout shown in FIG. 4A, the capacitor Cap1 overlaps the channel region of the drive transistor Tr1, so that the area occupied by the capacitor Cap2 outside the channel region is reduced accordingly and a blank portion Vac is generated in the layout. If necessary, the capacitor Cap2 may be further enlarged by extending the gate electrode 105 and the capacitor electrode 108b to the blank portion Vac. On the other hand, the size of the pixel may be reduced by eliminating the blank portion Vac.

Second Embodiment

Figure 5A:
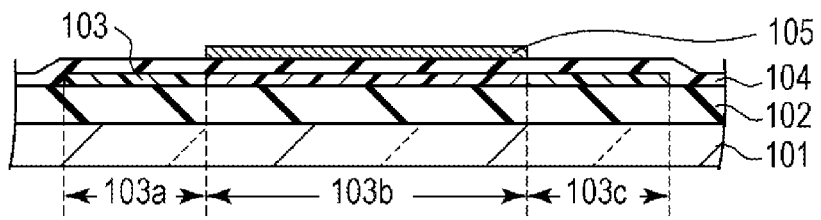
FIGS. 5A, 5B, 5C, 5D, and 5E are cross-sectional views of a transistor, which is a second embodiment according to one embodiment, during manufacturing and after completion.
Figure 5B:
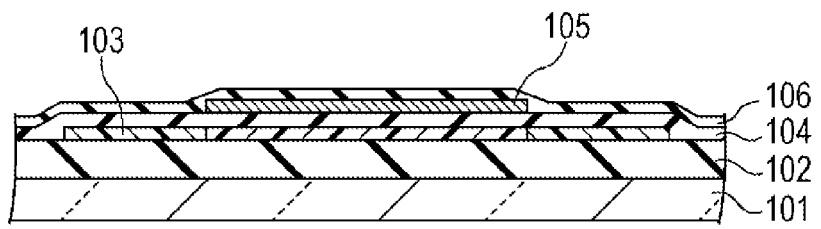
Figure 5C:
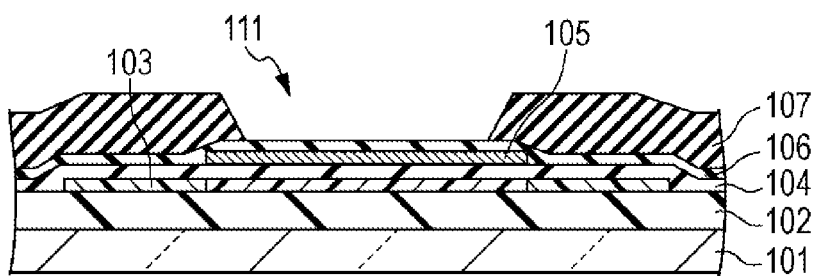
Figure 5D:
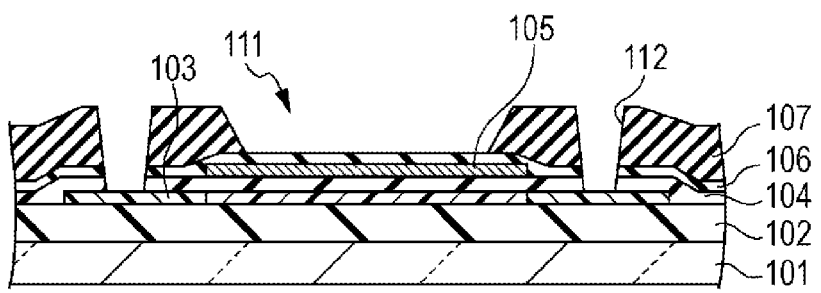
Figure 5E:
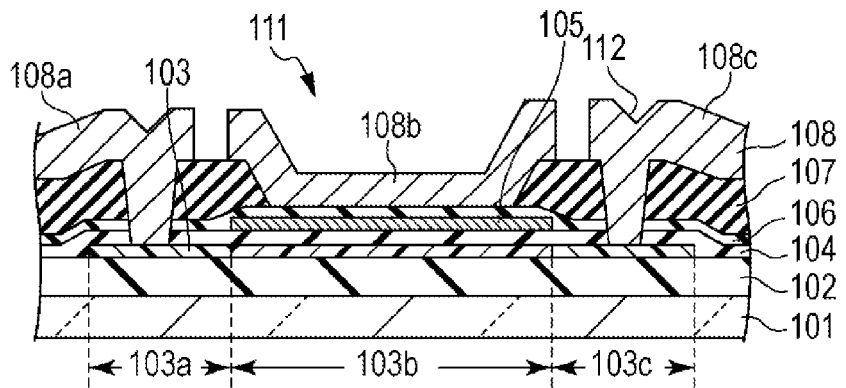

FIGS. 5A, 5B, 5C, and 5D show cross-sectional structures of a second embodiment in manufacturing processes and FIG. 5E shows a cross-sectional structure of the completed transistor. The same portions as those in FIGS. 3A, 3B, 3C, 3D, and 3E are denoted by the same reference characters.

A difference from the first embodiment is that the opening 111 is provided in the upper interlayer insulating film 107 above the channel region and the lower interlayer insulating film 106 is left. The other processes are the same as those in FIGS. 3A, 3B, 3C, 3D, and 3E, so that the description thereof will be omitted. A planar layout of the completed pixel circuit is the same as that shown in FIG. 4A.

In the process of FIG. 5B, the lower interlayer insulating film 106 is formed by using an inorganic insulating film such as silicon oxide, silicon nitride, aluminum oxide, and yttrium oxide, and the thickness of the lower interlayer insulating film 106 is 50 to 200 nm. In the present embodiment, the lower interlayer insulating film 106 functions as the second insulating layer that forms a capacitor, so that the lower interlayer insulating film 106 should be thin as much as possible in a range in which the lower interlayer insulating film 106 normally functions as an insulating film.

Next, the upper interlayer insulating film 107 is formed, and the opening 111 is made in a part of an area above the channel region 103b by a photolithography process and an etching process. FIG. 5C is a diagram showing a completed state of this process. The upper interlayer insulating film 107 is formed by using an inorganic insulating film such as silicon oxide and silicon nitride, and the thickness of the upper interlayer insulating film 107 is 100 to 800 nm.

By the above processes, the thin lower interlayer insulating film 106 is left above the channel region, and two-layer interlayer insulating film including upper and lower layers is left in areas other than the channel region. The thickness of the interlayer insulating film is 150 to 1000 nm in the two-layer portion and 50 to 200 nm in the one-layer portion, which is thinner than that of the two-layer portion.

FIG. 5E is a cross-sectional view of the completed transistor. The gate electrode 105 faces the capacitor electrode 108b above the channel region with the lower interlayer insulating film 106 sandwiched in between.

While the present invention has been described with reference to exemplary embodiments, it is to be understood that the embodiments are not limited to the disclosed exemplary embodiments. The scope of the following claims is to be accorded the broadest interpretation so as to encompass all such modifications and equivalent structures and functions.

This application claims the benefit of Japanese Patent Application No. 2011-034787 filed Feb. 21, 2011, which is hereby incorporated by reference herein in its entirety.

What is claimed is:

1. A semiconductor device comprising:
a semiconductor layer including a drain region, a channel region, and a source region;
a first insulating layer covering the semiconductor layer;
a gate electrode which is formed on the first insulating layer and has a portion overlapping the channel region of the semiconductor layer with the first insulating layer sandwiched in between;
a second insulating layer which is formed on the first insulating layer and covers the gate electrode;
a drain electrode and a source electrode which are formed on the second insulating layer and respectively connected to the drain region and the source region of the semiconductor layer through a contact hole formed in the first insulating layer and the second insulating layer; and
a capacitor electrode which is formed on the second insulating layer and has a portion facing the gate electrode with the second insulating layer sandwiched in between,
wherein the second insulating layer has a thin portion, whose thickness is thinner than that of the second insulating layer in surrounding regions, on the portion of the gate electrode overlapping the channel region, and
a part of the capacitor electrode faces the portion of the gate electrode overlapping the channel region with the thin portion of the second insulating layer sandwiched in between.

2. The semiconductor device according to claim 1, wherein the second insulating layer includes two insulating layers, and
the thin portion is a portion in which an opening is formed in either of the two insulating layers.

3. The semiconductor device according to claim 1, wherein the gate electrode extends outside the channel region, and
another part of the capacitor electrode faces the gate electrode extending outside the channel region with the second insulating layer sandwiched in between.

4. The semiconductor device according to claim 1, wherein the capacitor electrode and the source electrode are one continuous electrode.

5. A light-emitting device comprising:
the semiconductor device according to claim 1;
a power source line; and
a light-emitting element,
wherein an electric current determined by a voltage between the capacitor electrode and the gate electrode passes through the power source line and the semiconductor device and flows through the light-emitting element, so that the light-emitting element emits light.

6. The light-emitting device according to claim 5, wherein the light-emitting element is an organic electroluminescence element.

* * * * *